US007407838B2

(12) United States Patent
Kobori et al.

(10) Patent No.: US 7,407,838 B2
(45) Date of Patent: Aug. 5, 2008

(54) METHOD OF MANUFACTURING A SEMICONDUCTOR METHOD OF MANUFACTURING A THIN-FILM TRANSISTOR AND THIN-FILM TRANSISTOR

(75) Inventors: Isamu Kobori, Chiba (JP); Michio Arai, Tokyo (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 25 days.

(21) Appl. No.: 10/623,581

(22) Filed: Jul. 22, 2003

(65) Prior Publication Data

US 2005/0077518 A1    Apr. 14, 2005

Related U.S. Application Data

(62) Division of application No. 09/016,999, filed on Feb. 2, 1998, now Pat. No. 6,596,572, which is a division of application No. 08/623,506, filed on Mar. 28, 1996, now Pat. No. 5,767,529.

(30) Foreign Application Priority Data

Mar. 28, 1995 (JP) .................................. 7-96266

(51) Int. Cl.
H01L 21/00 (2006.01)
(52) U.S. Cl. ................ 438/149; 438/164; 257/E21.413
(58) Field of Classification Search ................ 438/128, 438/149, 151, 154, 164, 174, 180, 181, 194, 438/197, 199, 217, 229, 275, 276, 278, 287, 438/289–291, 299, 301, 311, 364, 365, 369, 438/378, 479, 491, 514, 517, 778, 791, 795, 438/761, 597, 586, 637; 257/E21.094, E21.413
See application file for complete search history.

(56) References Cited

U.S. PATENT DOCUMENTS 5,183,780 A * 2/1993 Noguchi et al. ............. 438/151

(Continued)

FOREIGN PATENT DOCUMENTS

EP        0641018        3/1995

(Continued)

OTHER PUBLICATIONS

Y. Fukushima et al.; "A Poly-Si TFT Process for High Speed and Low Voltage CMOS Circuits"; *Extended Abstracts of the 1993 International Conference on Solid State Devices and Materials, Makuhari*; pp. 993-995; 1993.
Notice of Rejection (Japanese Patent Application No. 2003-285552) mailed Apr. 17, 2007.

*Primary Examiner*—Michael S. Lebentritt
*Assistant Examiner*—Stanetta D Isaac
(74) *Attorney, Agent, or Firm*—Fish & Richardson P.C.

(57)        ABSTRACT

A method of manufacturing a semiconductor characterized in that, in polycrystallizing an amorphous silicon thin film formed on a substrate through an annealing process, the amorphous silicon thin film has a plane area of 1000 $\mu m^2$ or less. A thin-film transistor characterized by comprising an active silicon film which is formed of a plurality of island-like regions arranged in parallel to each other, each of the island-like regions being formed of a polycrystal silicon thin film having a plane area of 1000 $\mu m^2$ or less. A method of manufacturing a thin-film transistor comprising the steps of:
forming an amorphous silicon thin film on a substrate; processing the amorphous silicon thin film into a plurality of island-like regions each having a plane area of 1000 $\mu m^2$ or less; polycrystallizing an amorphous silicon thin film that forms the island-like regions through an annealing process; and forming a thin-film transistor having at least one of the plurality of island-like regions as an active silicon layer.

36 Claims, 6 Drawing Sheets

U.S. PATENT DOCUMENTS

| | | | |
|---|---|---|---|
| 5,341,012 A * | 8/1994 | Misawa et al. | 257/351 |
| 5,396,084 A * | 3/1995 | Matsumoto | 257/72 |
| 5,403,762 A * | 4/1995 | Takemura | 438/164 |
| 5,413,958 A | 5/1995 | Imahashi et al. | |
| 5,420,055 A * | 5/1995 | Vu et al. | 438/162 |
| 5,466,617 A * | 11/1995 | Shannon | 438/155 |
| 5,506,165 A * | 4/1996 | Sato | 438/30 |
| 5,529,630 A | 6/1996 | Imahashi et al. | |
| 5,595,923 A | 1/1997 | Zhang et al. | |
| 5,637,187 A * | 6/1997 | Takasu et al. | 438/30 |
| 5,670,297 A | 9/1997 | Ogawa et al. | |
| 5,712,191 A | 1/1998 | Nakajima et al. | |
| 5,717,224 A * | 2/1998 | Zhang | 257/57 |
| 5,717,473 A | 2/1998 | Miyawaki | |
| 5,731,613 A | 3/1998 | Yamazaki et al. | |
| 5,767,930 A | 6/1998 | Kobayashi et al. | |
| 5,807,772 A * | 9/1998 | Takemura | 438/157 |
| 5,815,223 A * | 9/1998 | Watanabe et al. | 349/42 |
| 5,818,070 A * | 10/1998 | Yamazaki et al. | 257/72 |
| 5,854,096 A | 12/1998 | Ohtani et al. | |
| 5,854,494 A | 12/1998 | Yamazaki et al. | |
| 5,904,509 A * | 5/1999 | Zhang et al. | 438/154 |
| 5,917,221 A * | 6/1999 | Takemura | 257/365 |
| 5,932,484 A * | 8/1999 | Iwanaga et al. | 438/689 |
| 5,937,282 A | 8/1999 | Nakajima et al. | |
| 5,959,313 A | 9/1999 | Yamazaki et al. | |
| 5,966,594 A | 10/1999 | Adachi et al. | |
| 5,990,491 A * | 11/1999 | Zhang | 257/57 |
| 6,051,453 A * | 4/2000 | Takemura | 438/166 |
| 6,071,764 A * | 6/2000 | Zhang et al. | 438/166 |
| 6,136,625 A * | 10/2000 | Nakazawa | 438/30 |
| 6,146,930 A * | 11/2000 | Kobayashi et al. | 438/154 |
| 6,198,133 B1 | 3/2001 | Yamazaki et al. | |
| 6,391,694 B1 * | 5/2002 | Zhang et al. | 438/164 |
| 6,501,097 B1 * | 12/2002 | Zhang | 257/72 |
| 6,776,880 B1 | 8/2004 | Yamazaki | |
| 2003/0036222 A1 * | 2/2003 | Takemura | 438/149 |
| 2003/0116766 A1 * | 6/2003 | Zhang | 257/72 |
| 2004/0227184 A1 | 11/2004 | Kobori et al. | |

FOREIGN PATENT DOCUMENTS

| | | |
|---|---|---|
| JP | 01-222432 | 9/1989 |
| JP | 2-150017 | 6/1990 |
| JP | 2-224255 | 9/1990 |
| JP | 05009089 A | 1/1993 |
| JP | 6-84793 | 3/1994 |
| JP | 6-123896 | 5/1994 |
| JP | 6-124962 | 5/1994 |
| JP | 06-260643 | 9/1994 |
| JP | 7066415 | 3/1995 |

* cited by examiner

METHOD OF MANUFACTURING A SEMICONDUCTOR METHOD OF MANUFACTURING A THIN-FILM TRANSISTOR AND THIN-FILM TRANSISTOR

CROSS-REFERENCE TO RELATED APPLICATION

This application is a divisional application of U.S. application Ser. No. 09/016,999, filed on Feb. 2, 1998, now U.S. Pat. No. 6,596,572, which is a divisional of U.S. application Ser. No. 08/623,506, filed on Mar. 28, 1996, now U.S. Pat. No. 5,767,529, which claims the benefit of a foreign priority application filed in Japan, Serial No. 07-096266, filed Mar. 28, 1995, all of which are incorporated by reference.

BACKGROUND OF THE INVENTION

1. Field of the Invention

The present invention relates to a semiconductor formed of a polycrystal silicon thin film, which is formed by crystallizing an amorphous silicon thin film on an insulator, and a thin-film transistor using that semiconductor.

2. Description of the Related Art

In recent years, a technique has been popularly researched where an amorphous silicon thin film is formed on an insulator such as a quartz substrate, allowed to grow into a solid-phase crystal (SPC) through a heating treatment or an annealing process due to the irradiation of a laser beam or an intense light to form a polycrystal silicon thin film.

A conventional general technique for obtaining a polycrystal silicon thin-film by allowing an amorphous silicon thin film to grow in a solid phase will be described below.

First, an, amorphous silicon thin film having a thickness of 500 to 5000 Å is formed on a quartz substrate.

Thereafter, the amorphous silicon thin film thus formed is heated to 400 to 1100° C. and subjected to an, annealing process to make the amorphous silicon thin film grow into crystal. In this situation, a heater, infrared rays or the like is used as heating means.

The annealing process may be conducted by the irradiation of a laser beam or an intense light other than heating.

In the above-mentioned manner, a polycrystal silicon thin film is obtained.

The polycrystal silicon thin film thus obtained is used as an active silicon layer of the thin-film transistor (TFT), to thereby provide a thin-film transistor. As a result, a liquid-crystal display unit, image sensor or the like which is high in operation speed and in image quality is obtained using the above thin film transistor.

Up to now, the polycrystal silicon thin film obtained by annealing the amorphous silicon thin film has difficulty in lowering a defect density in crystal.

The thin-film transistor using the polycrystal silicon thin film thus formed as the active silicon film is hindered from realizing an improvement in various characteristics of the thin-film transistor, for example, the lowering of a threshold voltage ($V_{th}$), an increase in mobility, a decrease in a leak current ($I_{off}$), etc., because the defect density in the active silicon layer is high.

SUMMARY OF THE INVENTION

The present invention has been made in view of the above circumstances, and therefore an object of this invention is to make a polycrystal silicon thin film obtained by annealing an amorphous silicon thin film low in defect density and high in quality.

Another object of the invention is to provide a thin-film transistor using a polycrystal silicon thin film obtained through an annealing process with a lowered threshold voltage ($V_{th}$) and leak current ($I_{off}$) and an increased mobility.

In order to solve the above-mentioned problem, according to one aspect of the, present invention, there is provided a method, of manufacturing a semiconductor characterized in that, in polycrystallizing an amorphous silicon thin film formed on a substrate through an annealing process, said amorphous silicon thin film has a plane area of 1000 $\mu m^2$ or less.

In the above-mentioned method, the amorphous silicon, thin film is preferably 1000 Å or more, more preferably 2000 Å to 10000 Å in thickness.

Also, according to another aspect of the present invention, there is provided a thin-film transistor having an active silicon film which is formed of a plurality of island-like regions arranged in parallel to each other, each of said island-like regions being formed of a polycrystal silicon thin film having a plane area of 1000 $\mu m^2$ or less.

In the thin-film transistor thus constituted, the island-like regions are formed of a polycrystal silicon thin film which is preferably 1000 Å or more, more preferably 2000 Å to 10000 Å in thickness.

Also, according to another aspect of the present invention, there is provided a method of manufacturing a thin-film transistor comprising the steps of: forming an amorphous silicon thin film on a substrate; processing said amorphous silicon thin film into a plurality of island-like regions having a plane area of 1000 $\mu m^2$ or less; polycrystallizing an amorphous silicon thin film that forms said island-like regions through an annealing process; and forming a thin-film transistor having at least one of said plurality of island-like regions as an active silicon layer.

In the above mentioned method, the amorphous silicon thin film is preferably 1000 Å or more, more preferably 2000 Å to 10000 Å in thickness.

The present applicant has found that after the amorphous silicon thin film has been formed as island-like regions each has a plane area (an area viewed from an upper surface of the substrate) of 1000 $\mu m^2$ or less, it is subjected to an annealing process by heating or the irradiation of a laser light beam or an intense light to form a polycrystal silicon thin film with the result that a polycrystal silicon thin film which is low in defect density and high in quality is obtained.

FIG. 1 is a graph showing a relationship between a threshold voltage ($V_{th}$) and an area of the island-like regions of the polycrystal silicon thin-film transistor, in which each of the island-like regions is 1250 Å in thickness.

As shown in FIG. 1, it has been found that as the area of the island-like regions is, small, the threshold voltage approaches 0 (zero) more, in both of a p-channel and an n-channel so that the defect density is lowered.

In FIG. 1, there has been found that an extremely excellent crystalline property is obtained when the plane area of each of the island-like regions is 1000 $\mu m^2$ or less.

Also, when the plane area of each of the island-like regions is 1000 $\mu m^2$ or less, the island-like regions may be of a square, a rectangle or other shapes.

Further, when the island-like regions are 1 $\mu m^2$ or more in plane area, the semiconductor is satisfactorily available as a device, and also it can be readily manufactured by a usual technique.

On the other hand, in the case where the polycrystal silicon thin film is provided as the active silicon layer of the thin-film transistor, because an area of the island-like regions is limited in size, the thin-film transistor using that polycrystal thin film is also limited in size, which causes a limit to the performance of the thin-film transistor.

Under the above circumstances, the applicant has found that a plurality of each of the island-like regions, a plane area of which is 1000 μm$^2$ or less is arranged in parallel to each other as active silicon layers that constitute the source region, the drain region and the channel formation region of a thin-film transistor so as to increase a substantial channel width, thereby being capable of obtaining a polycrystal thin-film transistor so as to increase a substantial channel width, thereby being capable of obtaining a polycrystal thin-film transistor which allows a sufficient amount of current to flow therein, which has the channel formation region low in defect density, and which is high in performance.

FIG. 3 shows an example of a plane shape of a thin-film transistor using a plurality of island-like regions as an active silicon layer.

In FIG. 3, a plurality of island-like regions 301 are arranged in parallel to each other to form an active silicon layer 305 of a thin-film transistor. On the island-like regions 301 are disposed a gate electrode 302, a source electrode 303 and a drain electrode 304 to form one thin-film transistor. Appropriate intervals between the respective island regions is several to several tens μm. As the intervals are small, the plane area of the active silicon layer can be reduced more.

In, the island-like region, as its plane area is reduced, the defect density is reduced more in a polycrystallized state, thereby being capable of reducing a leak current.

Also, the applicant has found that the amorphous silicon thin film is set to preferably 1000 Å or more, more preferably 2000 Å to 10000 Å in thickness, thereby lowering the defect density of the polycrystal silicon thin film obtained by crystallizing that amorphous silicon thin film.

FIG. 2 is a graph showing a relationship between the defect density of a polycrystal silicon thin film in a solid-phase growth and the thickness of an initial amorphous silicon thin film. In this case, a temperature of a solid-phase crystal (SPC) is 600° C.

It has been found from FIG. 2 that as the thickness is made thin, the defect density is reduced more.

However, in crystallizing the thick initial amorphous silicon thin film through an annealing process, a stress of about $3 \times 10^{-9}$ dyn/cm$^2$ due to a phase change is developed with the result that the polycrystal silicon thin film formed may be cracked.

Accordingly, when the polycrystal silicon thin film formed by crystallizing the thin amorphous silicon thin film is used as an active silicon layer that constitutes the channel formation region of the thin-film transistor as it is, this may cause the defect of the device or the lowering of the performance.

However, the applicant has found that even though the thickness of the amorphous silicon thin film is 1000 Å or more, more particularly 2000 Å to 10000 A, if each of the island-like regions formed of the amorphous silicon thin film are set to 1000 μm$^2$ or less in area and then annealed for crystallization, a polycrystal silicon thin film is obtained which has no cracks and is lower in the defect density.

Also, when the thickness of the amorphous silicon thin film becomes thicker than 10000 Å, cracks are liable to occur.

According to the present invention, there can be obtained a polycrystal thin-film transistor that allows a sufficient amount of current to flow therein, has a channel formation region which is low in defect density, and is high in performance.

The thin-film transistor like this can reduce power consumption because a threshold voltage ($V_{th}$) and a leak current ($I_{off}$) are lowered. Also, the thin-film transistor can operate at a high speed and allow a large current to flow therein because the mobility (μ) is increased.

BRIEF DESCRIPTION OF THE DRAWINGS

The above and other objects and features of the present invention will be more apparent from the following description taken in conjunction with the accompanying drawings.

DETAILED DESCRIPTION OF THE PREFERRED EMBODIMENTS

Now, a description will be given in detail of embodiments of the present invention.

First Embodiment

A first embodiment shows an example in which an active matrix circuit and a peripheral drive circuit both of which are formed of polycrystal silicon thin-film transistors are formed on the same substrate.

FIGS. 4A to 4D show a process of manufacturing the semiconductor in accordance with the first embodiment.

FIGS. 5A to 5D show the upper surfaces of the semiconductor in correspondence with FIGS. 4A to 4D, respectively. FIGS. 5A to 5D are diagrams viewed from the upper portions of FIGS. 4A to 4D. FIGS. 4A to 4D are cross-sectional views taken along a line A–A' of FIGS. 5A to 5D, respectively.

In FIGS. 4A to 4D, quartz was first used for a substrate 401. Instead, a glass substrate such as Corning Corp. 7059 may be used.

The substrate 401 is cleaned, and a silicon oxide under film 402 having a thickness of 2000 Å is formed through the plasma CVD technique using TEOS (tetra ethoxy silane) and oxygen as a raw gas.

Then, an initial amorphous silicon thin film having a thickness of 1000 Å or more, preferably 2000 Å to 10000 Å, in this example 3000 Å is formed by the plasma CVD technique.

Figure 1:
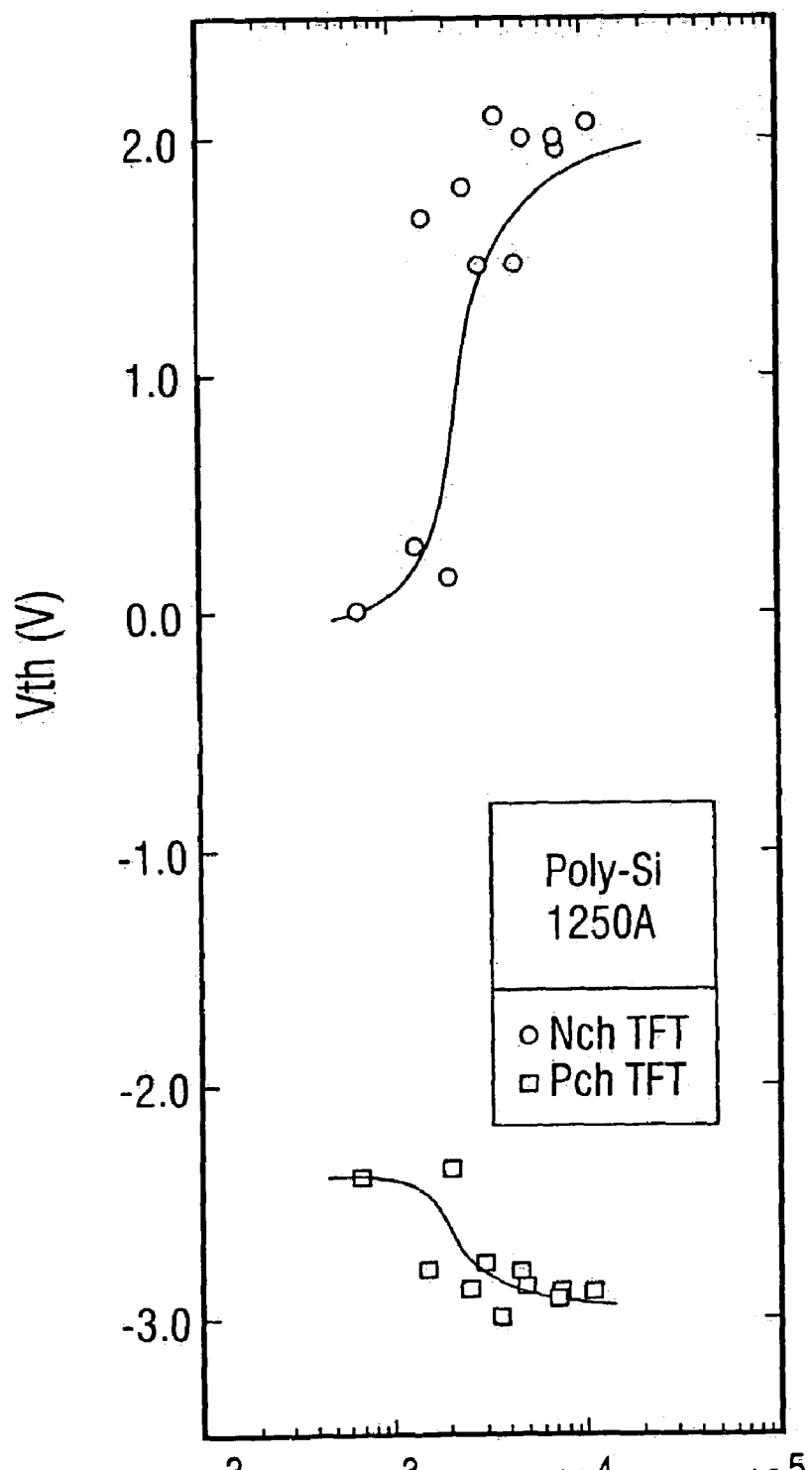
FIG. 1 is a graph showing a relationship between a threshold voltage ($V_{th}$) and an area of island-like regions of a polycrystal silicon thin-film transistor.
Figure 2:
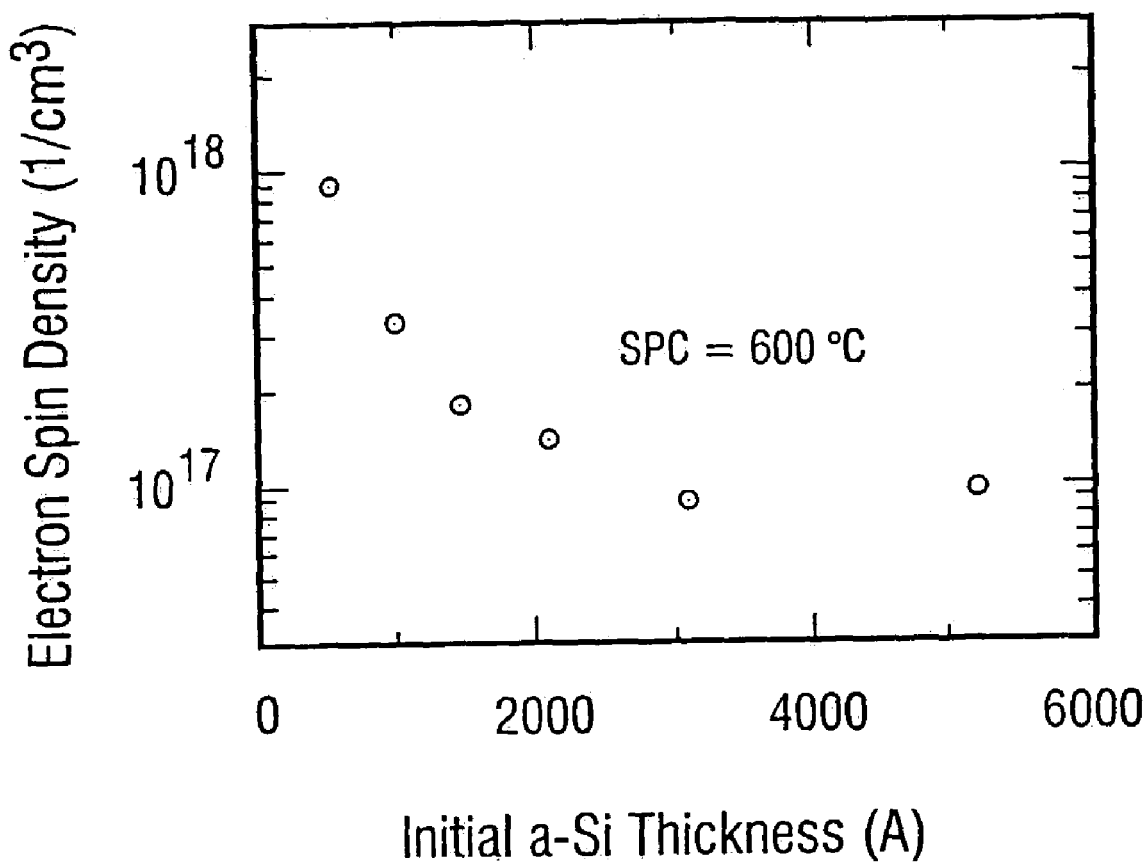
FIG. 2 is a graph showing a relationship between the defect density of a polycrystal silicon thin film in a solid-phase growth and the thickness of an initial amorphous silicon thin film.
Figure 3:
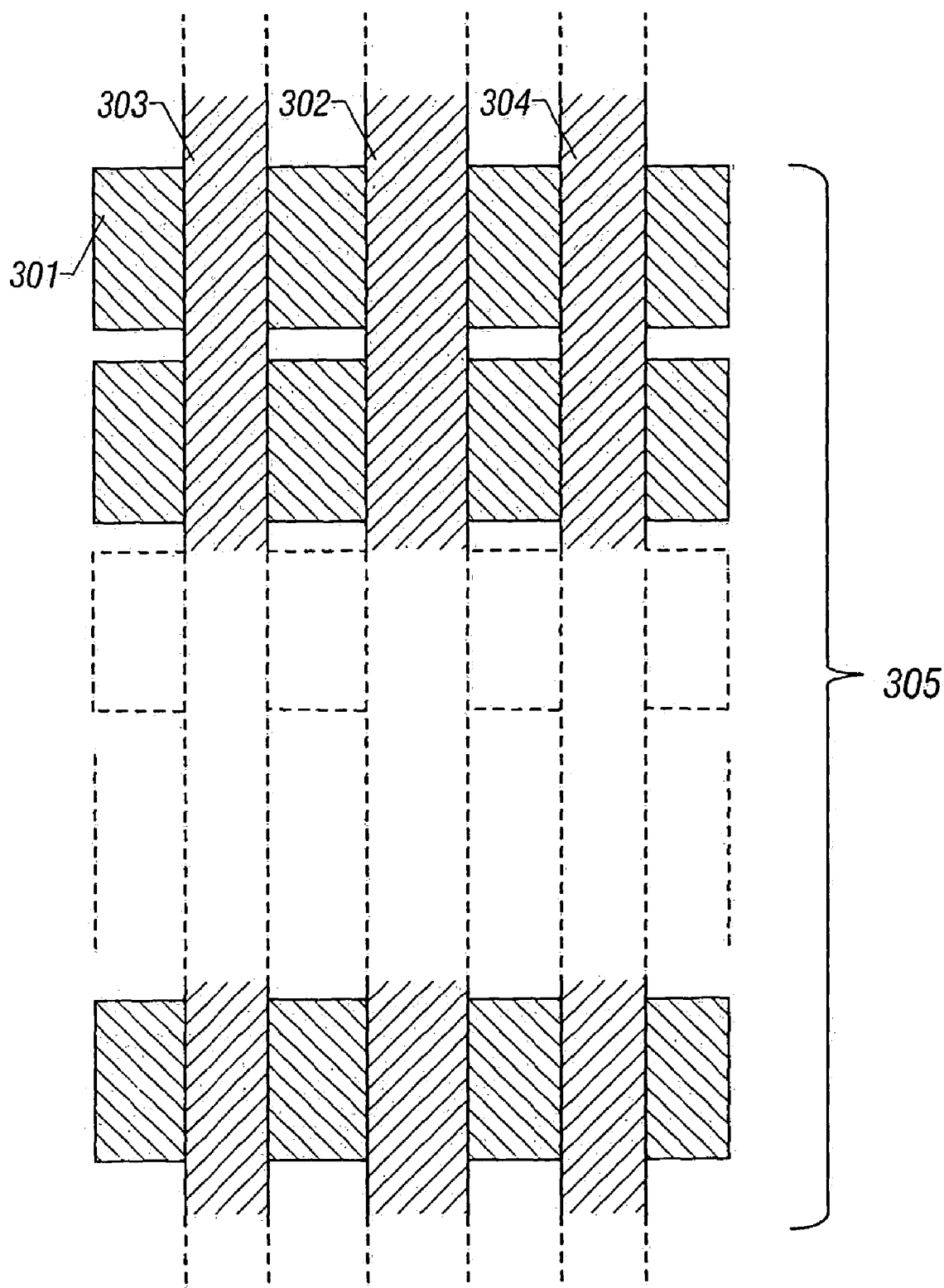
FIG. 3 is a diagram showing an example of a plane shape of a thin-film transistor using a plurality of island-like regions as an active silicon layer.
Figure 4A:
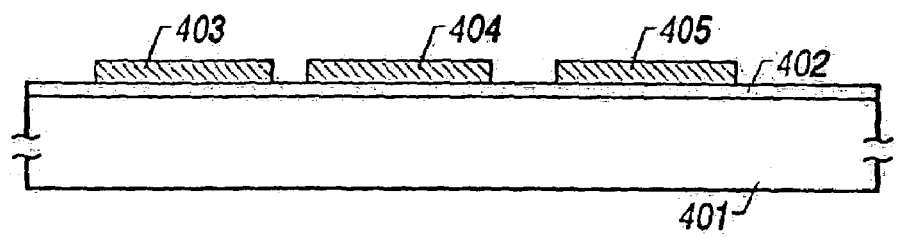
FIGS. 4A to 4D are diagrams showing a process of manufacturing a semiconductor in accordance with a first embodiment.

Subsequently, the initial amorphous silicon thin film is patterned through the dry etching in such a manner that island-like regions forming active silicon layers 403 to 405 are disposed at positions where thin-film transistors of an active matrix portion and a peripheral drive circuit portion are formed (FIG. 4A).

Figure 5A:
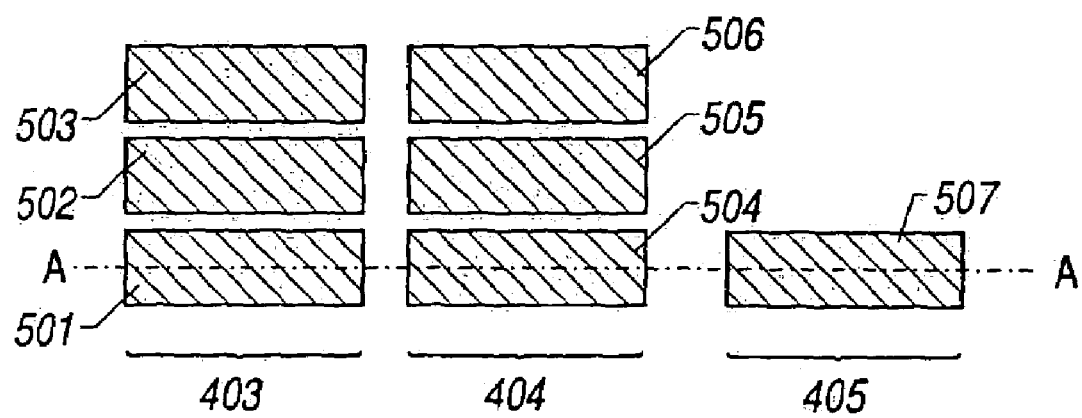
FIGS. 5A to 5D are diagrams showing the upper surfaces of the semiconductor shown in FIGS. 4A to 4D.

As shown in FIG. 5A, there are formed island-like regions 501 to 507 formed of amorphous silicon thin films to thereby form active silicon layers 403 to 405.

The size of each of the respective island-like regions is 20 μm×50 μm (width×length) in this example so that the area of the plane shape is set to 1000 μm² or less.

In the peripheral drive circuit portion requiring a high-speed drive, three island-like regions are provided for one thin-film transistor, and in the active matrix portion demanding a reduced leak current, one island-like region is provided for one thin-film transistor. It is needless to say that the number of island-like regions may be increased in accordance with a required standard.

In this, example, the respective intervals between each of the adjacent island-like regions that form one thin-film transistor of the peripheral drive circuit portion was set to 4 μm.

Also, in the thin-film transistor of the active matrix portion, the active silicon layer 405 is formed by one island-like region in this example, however, it is needless to say that it may be formed by a, plurality of island-like regions.

Also, the active silicon layer 405 may be formed by a plurality of island-like regions each, having a smaller plane area. In this case, the defect density is lowered more so that the leak current can be lowered.

Further, the shape of the island-like regions forming a thin-film transistor may be different between the active matrix portion and the peripheral drive circuit portion.

Then, the island-like regions formed of those amorphous silicon thin films are crystallized through the annealing process.

A substrate temperature was set to 500° C. to 1100° C., in this example 700° C., and a heating time was set to 2 hours to 72 hours, in this example 48 hours.

The annealing process may be conducted by the irradiation of a laser beam or an intense light (infrared rays or the like) other than heating.

Through that crystallizing process, the island-like regions 501 to 507 were formed into a polycrystal silicon thin film which has been crystallized excellently.

Thereafter, through the plasma CVD technique, a silicon oxide film 406 that functions as a gate insulating film was formed at a thickness of 1500 Å.

On the silicon oxide film 406, an aluminum film 6000 Å in thickness is formed through the sputtering technique and then patterned by etching, thereby forming gate electrodes 407 to 409.

Subsequently, the active silicon layers 403 to 405 were doped with impurities giving an n-type conduction type or a p-type conduction type in a self-matching manner with a mask of the gate electrodes 407 to 409 through the ion doping technique.

In this example, as the doping gas, phosphine ($PH_3$) was used for the n-type doping, and diborane ($B_2H_6$) was for the p-type doping.

In this example, the thin-film transistor in the pixel region was made the p-channel type. In other words, the active silicon layers 404 and 405 were doped with the p-type impurities, and the active silicon layer 403 was doped with the n-type impurities.

As a result, there can be formed p-type impurity regions 413, 415, 416 and 418, n-type impurity regions 410 and 412, and substantially-intrinsic channel formation regions 411, 414 and 417.

Figure 4B:
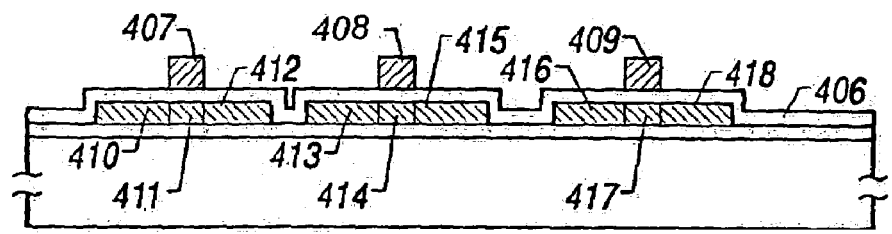

Thereafter, an annealing process was conducted on those regions at 400° C. to 800° C. for 1 to 12 hours, typically at 600° C. for two hours so that the doped impurities are activated (FIG. 4B).

Figure 5B:
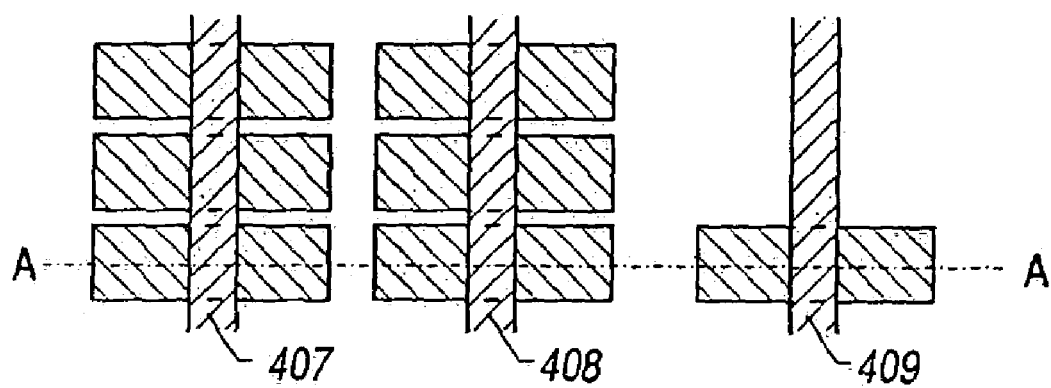

Shown in FIG. 5B is that in the respective active silicon layers 403 and 404, the gate electrodes 407 and 408 are disposed on a plurality of island-like regions.

Then, an insulating film consisting of a silicon nitride 500 Å in thickness and a silicon oxide 3000 Å in thickness was formed as a first interlayer insulator 419 thereon through the plasma CVD technique.

Figure 4C:
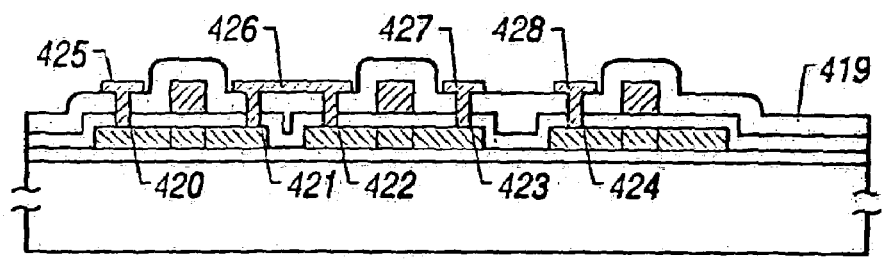
Figure 5C:
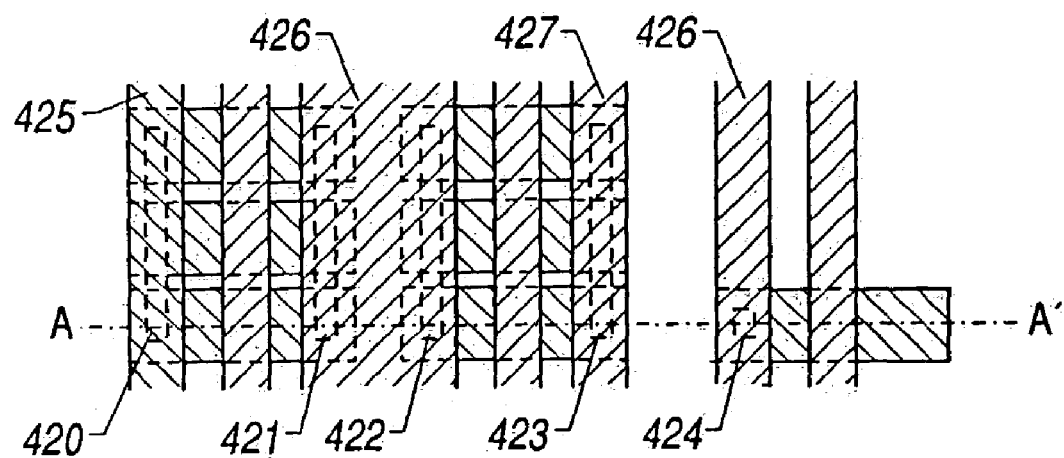

Subsequently, contact holes 420 to 424 are formed in the first interlayer insulator 419, and electrodes/wirings 425 to 428 were formed using a multi-layer film made of metal material, for example, titanium 500 Å in thickness and aluminum 400 Å in thickness (FIGS. 4C and 5C).

In the first embodiment, one of the contact holes 420 to 423 of the active silicon layers 403 and 404 is formed for three island-like regions as shown in FIG. 5C. However, one contact hole may be formed for each island-like region.

Thereafter, a silicon oxide thin film 4000 Å in thickness is further formed thereon through the plasma CVD technique as a second interlayer insulator 429.

Figure 4D:
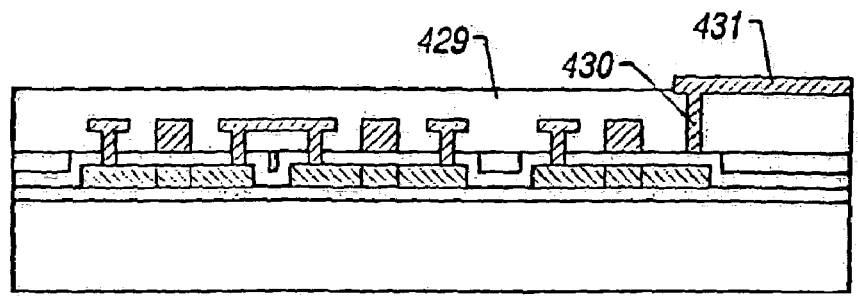
Figure 5D:
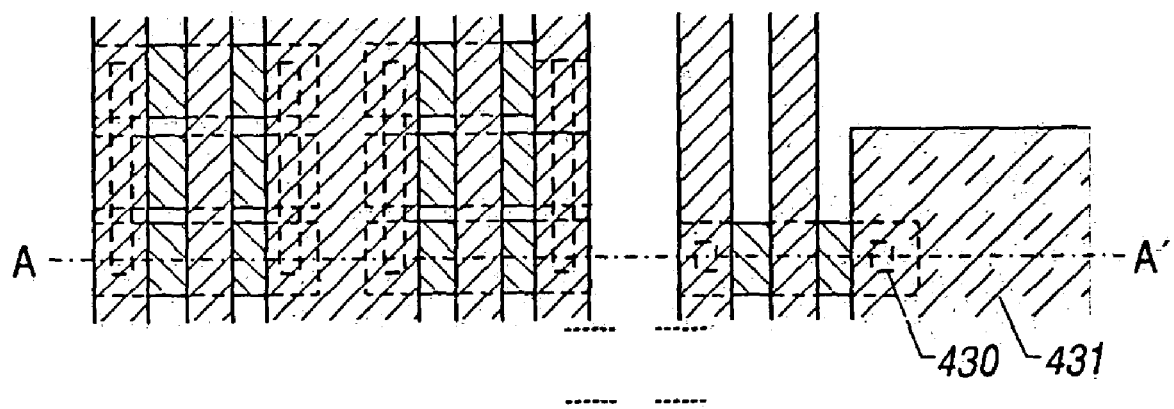

Then, a contact hole 430 was formed in the impurity region at the active matrix region side where the pixel electrode of a thin-film transistor is formed, and an ITO (indium tin oxide) film 800 Å in thickness was formed thereon. That film was so etched as to form a pixel electrode 431 (FIGS. 4D and 5D).

In that way, the active matrix portion and the peripheral drive circuit portion can be formed on the same substrate.

The active matrix circuit and the peripheral drive circuit thus formed is excellent because it is small in leak current ($I_{off}$), low in power consumption, and high in operation speed.

That substrate and an opposing substrate having an electrode on one surface thereof are located through liquid crystal, thereby being capable of manufacturing a liquid-crystal electro-optical device.

As was described above, according to the present invention, a polycrystal thin-film transistor can be obtained which allows a sufficient amount of current to flow therein, which has the channel formation region low in defect density, and which is high in performance.

The thin-film transistor like this allows the threshold voltage ($V_{th}$) and the leak current ($I_{off}$) to be lowered, the power consumption can be lowered. Also, because the mobility (μ) is increased, the thin-film transistor can operate at a high speed and allow a large current to flow therein.

The foregoing, description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method for manufacturing a device comprising a pixel region and a drive circuit, each comprising a transistor, with the drive circuit being connected to provide a drive signal to the transistor of the pixel region, said method comprising:

forming, at least in the pixel region, an active layer comprising a plurality of semiconductor islands arranged in parallel to each other over a substrate;

doping a p-type impurity into said active layer by ion doping to form a source region and a drain region in said active layer, said active layer comprising a part to become a channel region between said source region and said drain region;

forming a gate electrode adjacent to said part to become said channel region;

activating said p-type impurity by annealing;

forming an interlayer insulating film comprising a silicon nitride layer and a silicon oxide layer over said active layer by plasma CVD, said silicon nitride layer and said silicon oxide layer formed over said gate electrode and said active layer; and forming a conductive layer comprising titanium and aluminum over said interlayer insulating film, wherein said transistor of said pixel region comprises said channel region and said gate electrode and said source region and said drain region.

2. A method according to claim 1 wherein said device comprises a liquid-crystal display.

3. A method according to claim 1 wherein said device comprises an image sensor.

4. A method according to claim 1 wherein said device comprises a liquid-crystal electro-optical device.

5. A method according to claim 1 wherein each of said semiconductor islands comprises amorphous semiconductor and has a plane area of 1000 $\mu m^2$ or less.

6. A method according to claim 5 further comprising crystallizing said amorphous semiconductor.

7. A method for manufacturing a device comprising a pixel region and a drive circuit, each comprising a transistor, with the drive circuit being connected to provide a drive signal to the transistor of the pixel region, said method comprising:

forming, at least in the pixel region, anactive layer comprising a plurality of semiconductor islands arranged in parallel to each other over a substrate;

doping a p-type impurity into said active layer by ion doping to form a p-type impurity region in said active layer, said active layer comprising a part to become a channel region adjacent to said p-type impurity region;

forming a gate electrode adjacent to said part to become said channel region;

activating said p-type impurity by annealing;

forming an interlayer insulating film comprising a silicon nitride layer and a silicon oxide layer over said active layer by plasma CVD, said silicon nitride layer and said silicon oxide layer formed over said gate electrode and said active layer; and forming a conductive multi-layer film comprising a titanium layer and an aluminum layer over said interlayer insulating film, wherein said transistor of said pixel region comprises said channel region and said gate electrode and said p-type, impurity region.

8. A method according to claim 7 wherein said device comprises a liquid-crystal display.

9. A method according to claim 7 wherein said device comprises an image sensor.

10. A method according to claim 7 wherein said device comprises a liquid-crystal electro-optical device.

11. A method according to claim 7 wherein each of said semiconductor islands comprises amorphous semiconductor and has a plane area of 1000 $\mu m^2$ or less.

12. A method according to claim 11 further comprising crystallizing said amorphous semiconductor.

13. A method for manufacturing a device comprising a pixel region and a drive circuit, each comprising a transistor, with the drive circuit being connected to provide a drive signal to the transistor of the pixel region, said method comprising:

forming, at least in the pixel region, an active layer comprising a plurality of semiconductor islands arranged in parallel to each other over a substrate;

doping a p-type impurity into said active layer by ion doping to form a p-type impurity region in said active layer, said active layer comprising a part to become a channel region adjacent to said p-type impurity region;

forming a gate electrode adjacent to said part to become said channel region;

activating said p-type impurity by annealing;

forming an interlayer insulating film comprising a silicon nitride layer and a silicon oxide layer over said active layer by plasma CVD, said silicon nitride layer and said silicon oxide layer formed over said gate electrode and said active layer; and forming a conductive layer comprising titanium and aluminum over said interlayer insulating film, wherein said transistor of said pixel region comprises said channel region and said gate electrode and said p-type impurity region.

14. A method according to claim 13 wherein said conductive layer comprises an electrode.

15. A method according to claim 13 wherein said conductive layer comprises a wiring.

16. A method according to claim 13 wherein said device comprises a liquid-crystal display.

17. A method according to claim 13 wherein said device comprises an image sensor.

18. A method according to claim 13 wherein said device comprises a liquid-crystal electro-optical device.

19. A method according to claim 13 wherein each of said semiconductor islands comprises amorphous semiconductor and has a plane area of 1000 $\mu m^2$ or less.

20. A method according to claim 19 further comprising crystallizing said amorphous semiconductor.

21. A method according to claim 13 wherein said conductive layer comprises a multi-layer film including a titanium layer and an aluminum layer.

22. A method for manufacturing a device comprising a pixel region and a drive circuit, each comprising a transistor, with the drive circuit being connected to provide a drive signal to the pixel region, said method comprising:

forming, at least in the pixel region, an active layer comprising a plurality of semiconductor islands arranged in parallel to each other over a substrate;

doping a p-type impurity into said active layer by ion doping to form a source region and a drain region in said active layer, said active layer comprising a part to become a channel region between said source region and said drain region;

forming a gate electrode adjacent to said part to become said channel region;

activating said p-type impurity by annealing;

forming a first interlayer insulating film comprising a silicon nitride layer and a silicon oxide layer over said active layer by plasma CVD, said silicon nitride layer and said silicon oxide layer formed over said gate electrode and said active layer;

forming a conductive layer comprising a titanium and an aluminum over said first interlayer insulating film;

forming a second interlayer insulating film over said conductive layer; and forming a pixel electrode over said second interlayer insulating film, wherein said transistor of said pixel region comprises said channel region and said gate electrode and said source region and said drain region.

23. A method according to claim 22 wherein said device comprises a liquid crystal display.

24. A method according to claim 22 wherein said device comprises an image sensor.

25. A method according to claim 22 wherein each of said semiconductor islands comprises amorphous semiconductor and has a plane area of 1000 $\mu m^2$ or less.

26. A method according to claim 25 further comprising crystallizing said amorphous semiconductor.

27. A method for manufacturing a device comprising a pixel region and a drive circuit, each comprising a transistor, with the drive circuit being connected to provide a drive signal to the transistor of the pixel region, said method comprising:
forming, at least in the pixel region, an active layer comprising a plurality of semiconductor islands arranged in parallel to each other over a substrate;
doping a p-type impurity into said active layer by ion doping to form a source region and a drain region in said active layer, said active layer comprising a part to become a channel region between said source region and said drain region;
forming a gate electrode adjacent to said part to become said channel region;
activating said p-type impurity by annealing;
forming a first interlayer insulating film comprising a silicon nitride layer and a silicon oxide layer over said active layer by plasma CVD, said silicon nitride layer and said silicon oxide layer formed over said gate electrode and said active layer;
forming a conductive layer comprising a titanium and an aluminum over said first interlayer insulating film;
forming a second insulating film comprising silicon oxide over said conductive layer; and
forming a pixel electrode over said second insulating film,
wherein said transistor of said pixel region comprises said channel region and said gate electrode and said source region and said drain region.

28. A method according to claim 27 wherein said device comprises a liquid crystal display.

29. A method according to claim 27 wherein said device comprises an image sensor.

30. A method according to claim 27 wherein each of said semiconductor islands comprises amorphous semiconductor and has a plane area of 1000 $\mu m^2$ or less.

31. A method according to claim 30 further comprising crystallizing said amorphous semiconductor.

32. A method for manufacturing a device comprising a pixel region and a drive circuit, each comprising a transistor, with the drive circuit being connected to provide a drive signal to the transistor of the pixel region, said method comprising:
forming, at least in the pixel region, an active layer comprising a plurality of semiconductor islands arranged in parallel to each other over a substrate;
doping a p-type impurity into said active layer by ion doping to form a source region and a drain region in said active layer, said active layer comprising a part to become a channel region between said source region and said drain region;
forming a gate electrode adjacent to said part to become said channel region;
activating said p-type impurity by annealing;
forming a first interlayer insulating film comprising a silicon nitride layer and a silicon oxide layer over said active layer by plasma CVD, said silicon nitride layer and said silicon oxide layer formed over said gate electrode and said active layer;
forming a conductive layer comprising a titanium and an aluminum over said first interlayer insulating film;
forming a second insulating film comprising silicon oxide over said conductive layer; and
forming a pixel electrode comprising indium tin oxide over said second insulating film,
wherein said transistor of said pixel region comprises said channel region and said gate electrode and said source region and said drain region.

33. A method according to claim 32 wherein said device comprises a liquid crystal display.

34. A method according to claim 32 wherein said device comprises an image sensor.

35. A method according to claim 32 wherein said semiconductor layer comprises an amorphous semiconductor island having each of said semiconductor islands comprises amorphous semiconductor and has a plane area of 1000 $\mu m^2$ less.

36. A method according to claim 35 further comprising crystallizing said amorphous semiconductor.

* * * * *